United States Patent
Kaneda et al.

(10) Patent No.: US 7,452,756 B2
(45) Date of Patent: Nov. 18, 2008

(54) SEMICONDUCTOR DEVICE AND MANUFACTURING PROCESS THEREOF

(75) Inventors: Mitsuru Kaneda, Tokyo (JP); Hideki Takahashi, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/979,527

(22) Filed: Nov. 5, 2007

(65) Prior Publication Data

US 2008/0064148 A1 Mar. 13, 2008

Related U.S. Application Data

(62) Division of application No. 11/163,248, filed on Oct. 11, 2005, now Pat. No. 7,326,996.

(30) Foreign Application Priority Data

Jan. 27, 2005 (JP) ............................. 2005-020087

(51) Int. Cl.
*H01L 21/20* (2006.01)
*H01L 21/338* (2006.01)
*H01L 23/62* (2006.01)

(52) U.S. Cl. .................. 438/138; 438/140; 438/148; 257/342; 257/378; 257/474

(58) Field of Classification Search ................ 438/138, 438/140, 148; 257/342, 378, 474
See application file for complete search history.

(56) References Cited

U.S. PATENT DOCUMENTS

| | | | |
|---|---|---|---|
| 5,698,454 | A | 12/1997 | Zommer |
| 6,987,285 | B2 | 1/2006 | Nagashima et al. |
| 7,157,785 | B2 | 1/2007 | Takei et al. |

| | | | |
|---|---|---|---|
| 2001/0040255 | A1 | 11/2001 | Tanaka |
| 2004/0063302 | A1 | 4/2004 | Takahashi et al. |

FOREIGN PATENT DOCUMENTS

CN 1485927 3/2004

(Continued)

*Primary Examiner*—Marcos D. Pizarro
*Assistant Examiner*—Steven H Rao
(74) *Attorney, Agent, or Firm*—Buchanan Ingersoll & Rooney PC

(57) ABSTRACT

The semiconductor device according to one of the aspects of the present invention includes a semiconductor substrate of a first conductivity type, having upper and lower surfaces. A collector region of a second conductivity type is formed on the lower surface of the semiconductor substrate, and a collector electrode is formed on the collector region. Also, at least one pair of isolation regions of the second conductivity type are formed extending from the upper surface of the semiconductor substrate to the collector layer for defining a drift region of the first conductivity type, in conjunction with the collector region. A base region of the second conductivity type is formed adjacent the upper surface of the semiconductor substrate and within the drift region, and an emitter region of the first conductivity type is formed adjacent the upper surface of the semiconductor substrate and within the base region. A gate electrode is formed opposing to the base region via an insulating layer. An emitter electrode is formed on the emitter region. The collector layer has thickness in the range between 17 μm to 50 μm.

6 Claims, 5 Drawing Sheets

FOREIGN PATENT DOCUMENTS

| | | |
|---|---|---|
| DE | 196 30 761 | 2/1997 |
| JP | 6-196705 | 7/1994 |
| JP | 2002-319676 | 10/2002 |
| JP | 2003-218354 | 7/2003 |
| JP | 2003-318399 | 11/2003 |
| JP | 2004-311481 | 11/2004 |

SEMICONDUCTOR DEVICE AND MANUFACTURING PROCESS THEREOF

BACKGROUND OF THE INVENTION

1) Technical field of the Invention

The present invention relates to a semiconductor device and a manufacturing process thereof, and in particular to an IGBT (Insulated Gate Bipolar Transistor) and a manufacturing process thereof.

2) Description of Related Arts

Various power conversion circuit devices have been proposed for driving motors of recent industrial equipments such as elevators and pumps. While the power conversion circuit devices may be categorized into direct and indirect ones, the indirect (inverter-control type) power conversion circuit device has commonly been used in the art so far. In the meantime, the direct power circuit such as an AC matrix converter has many advantages superior to the inverter control type power conversion circuit, including downsizing and extended lifetime of the power conversion circuit device due to elimination of the electrolytic capacitor.

The AC matrix converter includes, in general, a plurality of bidirectional switches, each of which may be structured by a pair of IGBTs reversely connected in parallel. Thus, the IGBT used for the AC matrix converter blocks voltage to have high withstanding voltage both in forward and reverse directions during turning-off. In the context of the present application, the IGBT blocking voltage not only in a forward direction but also reverse direction is referred to as a "reverse blocking IGBT".

In the bidirectional switch fashioned with a pair of the reverse blocking IGBTs, one of the reverse blocking IGBT controls the driving current therethrough, and the other one allows the recovery current from the load by turning on after the former turns off. Thus, the latter IGBT has a function serving as a free wheel diode in the inverter-control type power conversion circuit device, running the recovery current from the load in the direction reverse to the driving current. When running the recovery current, the latter IGBT generates a considerable amount of recovery loss since the $p^+$-type collector region (collector layer) thereof has a substantial thickness and a high impurity concentration.

The Japanese Patent Publication Application, JP 2002-319676, A, for example, discloses the technique to thermally anneal the $p^+$-type collector region for activating the impurity ions therein and obtaining desired peak impurity concentration, thereby reducing the recovery loss. However, this approach reduces the recovery loss, yet deteriorates the withstanding voltage (breakdown voltage) in an intolerable manner. The above-referenced patent application suggests that the annealing temperature is preferably less than 500 degrees centigrade, because the higher temperature raises the ohmic contact resistance between the emitter region and the emitter electrode. Such rather low annealing temperature is insufficient to activate the impurity ions in the collector region, so that lattice defects due to the doped impurity remain in the collector region. Thus, when applied with reverse voltage, the depletion region likely extends over the collector region with the lattice defects, a leak current likely runs through the lattice defects so that the withstanding voltage is reduced.

SUMMARY OF THE INVENTION

Therefore, one of the aspects of the present invention addresses the drawbacks and has an object to provide a semiconductor device minimizing the recovery loss while maintaining the high withstanding voltage (breakdown voltage).

In particular, the semiconductor device according to one of the aspects of the present invention includes a semiconductor substrate of a first conductivity type, having upper and lower surfaces. A collector region of a second conductivity type is formed on the lower surface of the semiconductor substrate, and a collector electrode is formed on the collector region. Also, at least one pair of isolation regions of the second conductivity type are formed extending from the upper surface of the semiconductor substrate to the collector layer for defining a drift region of the first conductivity type, in conjunction with the collector region. A base region of the second conductivity type is formed adjacent the upper surface of the semiconductor substrate and within the drift region, and an emitter region of the first conductivity type is formed adjacent the upper surface of the semiconductor substrate and within the base region. A gate electrode is formed opposing to the base region via an insulating layer. An emitter electrode is formed on the emitter region. The collector layer has thickness in the range between 17 μm to 50 μm.

Further scope of applicability of the present invention will become apparent from the detailed description given herein. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention more fully be understood from the detailed description given herein and accompanying drawings which are given by way of illustration only, and thus are not limitative of the present invention.

DETAILED DESCRIPTION OF THE PREFERRED EMBODIMENTS

Referring to the attached drawings, the details of embodiment according to the present invention will be described herein. In those descriptions, although the terminology indicating the directions (for example, "upper" and "lower") is conveniently used just for clarity, it should not be interpreted that those terminology limit the scope of the present invention.

Figure 1:
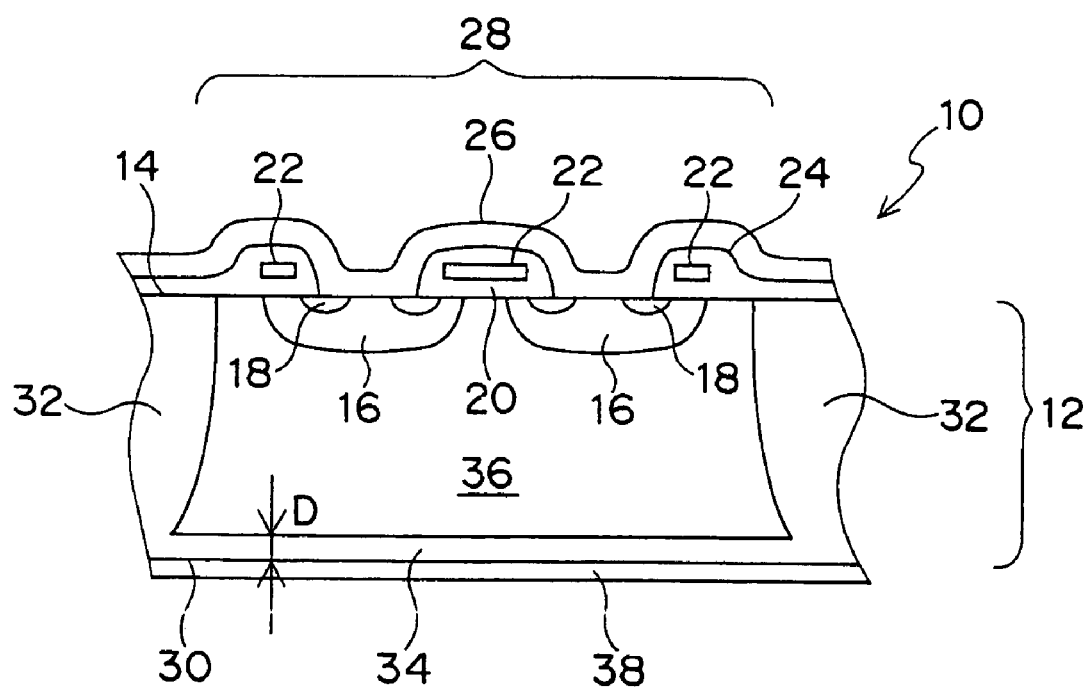
FIG. 1 is a cross sectional view of one embodiment of the semiconductor device according to the present invention.

With reference to FIG. 1, a stacked structure of a semiconductor device of one embodiment according to the present invention will be described herein. The semiconductor device 10 includes an n-type (first conductivity type) semiconductor substrate 12 having an $n^-$-type drift region 36. Provided within the drift region 36 and adjacent the upper surface 14 of the semiconductor substrate 12 is a p-type (second conductivity type) base region 16, in which an $n^+$-type emitter region 18 is formed. A plurality of channel regions (not shown) are defined in the base regions 16 and between the emitter region 18 and the drift region 36. Also, a gate electrode 22 is deposited over the channel region via a gate oxide layer 20, and is embedded within an insulating interlayer 24. Further, an emitter electrode 26 is formed on the base region 16 and the emitter region 18, and is formed over the gate electrode 22 via the insulating interlayer 24. Although FIG. 1 illustrates only two of the base regions 16, three or more of the base regions may be formed.

Also, the semiconductor device 10 includes p$^+$-type isolation regions 32 extending from the upper surface through the drift region 36 up to a p$^+$-type collector region (collector layer) 34 on the lower surface 30 of the semiconductor substrate 12. Thus, the drift region 36 is defined and surrounded by the isolation regions 32 and the collector regions 34. Further, the semiconductor device 10 includes a collector electrode 38 on the collector region 36.

In the semiconductor device 10 so structured, the IGBT (Insulated Gate Bipolar Transistor) 28 is defined. In the above description, although the semiconductor substrate 12 and other regions having particular conductivity type (e.g., n-type) is illustrated, the conductivity type is interchangeable to other conductivity type (e.g., p-type).

Next, the operation of the semiconductor device 10 will be briefly described herein. When the collector electrode 38 is provided with positive voltage in relative to the emitter electrode 26 (i.e., the forward voltage is applied therebetween), the positive voltage applied on the gate electrode 22 causes the channel region between the emitter region and the drift region to have good conductivity, so that the forward current runs from collector electrode 38 to the emitter electrode 26 via the channel region.

Also, when the forward voltage is applied between the collector electrode 38 and the emitter electrode 26 and no voltage is applied to the gate electrode 22, the depletion region extends from the PN junction between the base region 16 and the drift region 36 towards the collector electrode 38. This causes high withstanding voltage in the forward direction.

On the other hand, when the collector electrode 38 is provided with negative voltage in relative to the emitter electrode 26 (i.e., the reverse voltage is applied therebetween), the depletion region extends from the PN junction between the collector region 34/isolation regions 32 and the drift region 36 towards the drift region 36/base regions 16. This realizes high withstanding voltage in the reverse direction.

Figure 2A:
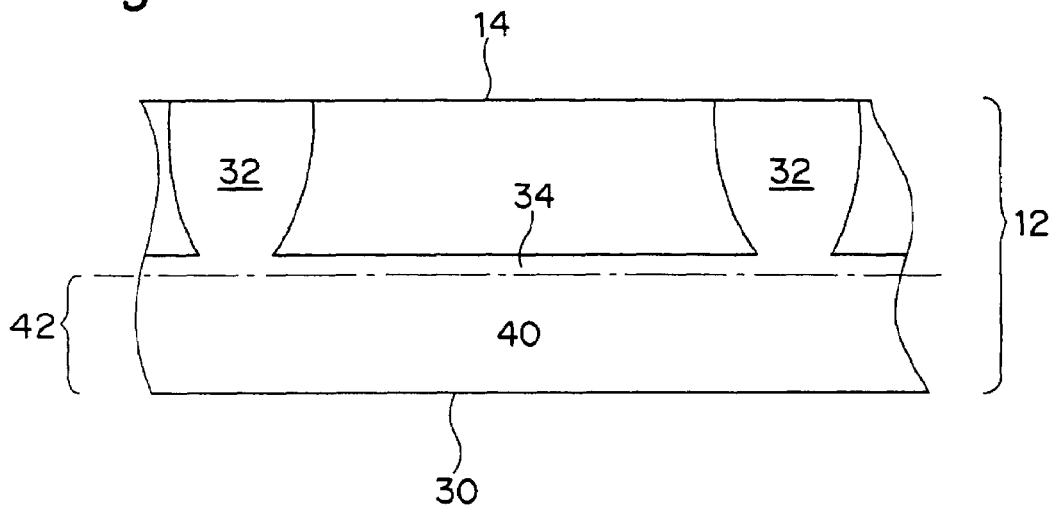
FIGS. 2A-2C are cross sectional views of one embodiment of the semiconductor device, illustrating a manufacturing process thereof.

Next, with reference to FIGS. 2A-2C, the manufacturing process of the semiconductor device will be described herein. As illustrated in FIG. 2A, a diffusion technique is used for simultaneously forming the p$^+$-type isolation regions 32 in the semiconductor substrate 12 and the p$^+$-type regions 40 across the lower surface 30 of the semiconductor substrate 12. The diffusion technique referred herein may include thermal-diffusion by allowing p-type impurity material on the n-type semiconductor substrate to be doped in thermal equilibrium state, or ion-implantation by implanting the p-type impurity material into the semiconductor substrate before thermally annealing to form a region of high impurity concentration.

In the thermal-diffusion, the p-type impurity material is doped from the upper and lower surfaces 14, 30 of the drift region deeply enough so that the p$^+$-type isolation region 32 and the p$^+$-type regions 40 meet with or overlap each other at the middle in the thickness direction, as shown in FIG. 2A. In other words, the thickness of the p$^+$-type isolation region 32 from the upper surface 14 is the same as the thickness of the p$^+$-type regions 40 from the lower surface 30. Although needless to mention, the simultaneous formation of the p$^+$-type isolation region 32 and the p$^+$-type regions 40 needs a time less than that in case where the regions 32, 40 are formed subsequently.

Also, the p$^+$-type region 40 so formed has the high impurity concentration same as the p$^+$-type isolation region 32, and impurity concentration gradation greater as being close to the upper and lower surfaces 14, 30 of the semiconductor substrate 12. Thus, the lattice defects in the highly doped p$^+$-type region 40 tends to gather towards the lower surface 30 of the semiconductor substrate 12. As described later, after formation of other regions for the IGBT, the p$^+$-type regions 40 is polished from the lower surface 30 (i.e., a portion 42 of the p$^+$-type regions 40 is removed) to form the p$^+$-type collector region 34, so that the p$^+$-type region 40 performs a function of a gettering layer. Thus, substantially no lattice defect remains in the resultant collector region 34.

Figure 2B:
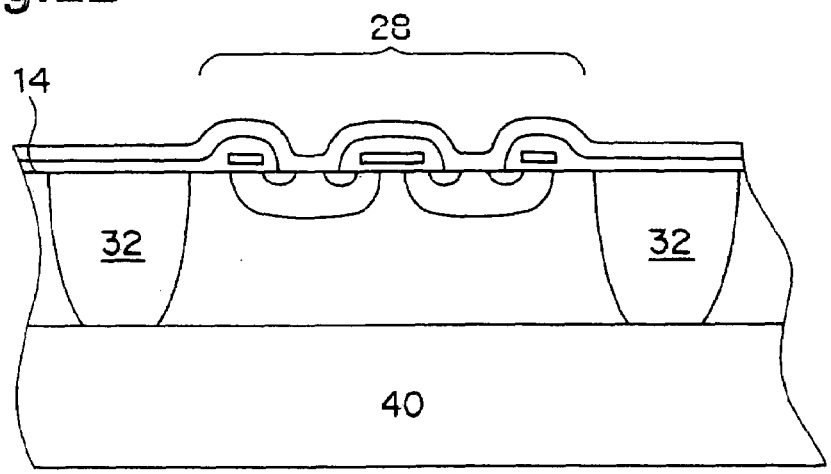
Figure 2C:
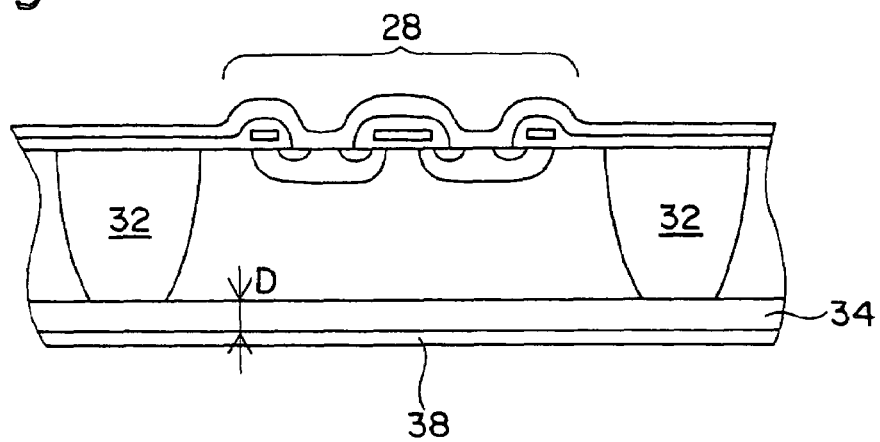

Further, as shown in FIG. 2B, after formation of the p$^+$-type region 40 and the p$^+$-type isolation region 32, several regions structuring the IGBT 28 are formed. Thus, the high temperature in the thermal-diffusion or annealing after the ion-implantation provides no adverse effect on the formation of the regions of the IGBT 28 such as the emitter region 18 and the emitter electrode 26. That is, unlike the manufacturing process disclosed in the above-referenced patent publication, increase of the ohmic contact resistance between the emitter region 18 and the emitter electrode 26 is prevented. In other words, the p-type impurity material is doped at fairly high temperature in the thermal-diffusion for forming the p$^+$-type regions 40.

Since, as shown in FIG. 2B, the steps for forming the several regions/layers of the IGBT 28 are similar to ones well-known in the art, only a brief explanation therefor will be described herein.

As illustrated in FIG. 1, the p-type base region 16 is formed adjacent the upper surface 14 of the semiconductor substrate 12, and then the n$^+$-type emitter region 18 is formed within the base region 16. Also, the gate electrode 22 is deposited over the channel region (not shown) between the emitter region 18 and the drift region 36 via the gate oxide layer 20, and is embedded within an insulating interlayer 24. These steps achieve the IGBT 28.

As described above, the lower portion 42 of the p$^+$-type regions 40 is removed by polishing to form the p$^+$-type collector region 34 having a predetermined thickness D, which will be discussed hereinafter. Then, the collector electrode 38 is deposited on the polished collector region 34, thereby to realize the semiconductor device of the present invention.

It should be noted that in order to reduce the ohmic contact resistance between the p$^+$-type collector region 34 and the collector electrode 38, another p-type region (not shown), of which impurity concentration is higher than that of the collector region 34, may be deposited on the collector region 34 by further injecting the p-type impurity material onto the collector region 34.

Next, referring to FIGS. 3-5, the predetermined thickness D of the p$^+$-type collector region 34 will be discussed herein.

Figure 3:
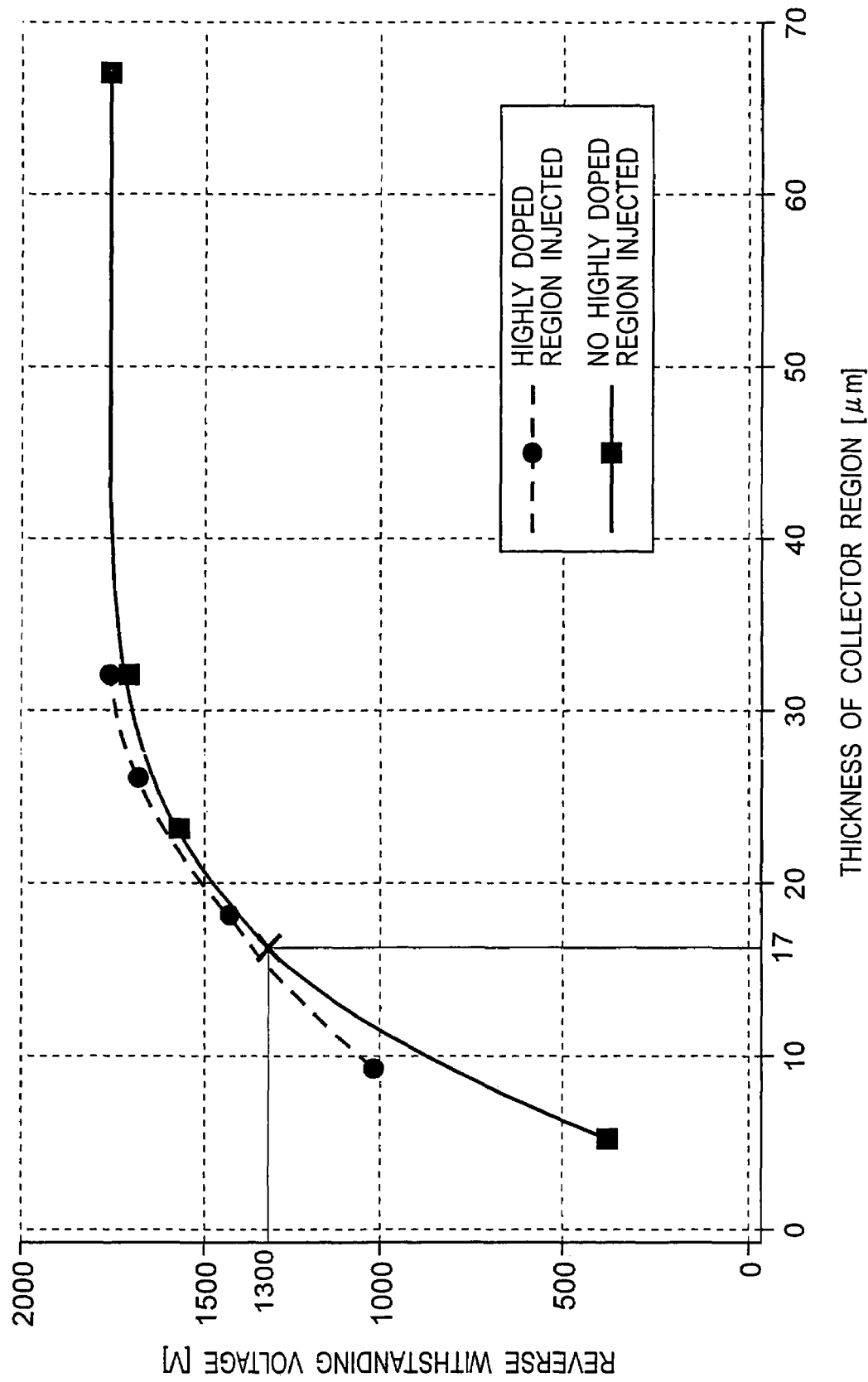
FIG. 3 is a graph showing a relationship between thickness of collector region and reverse withstanding voltage.
Figure 4:
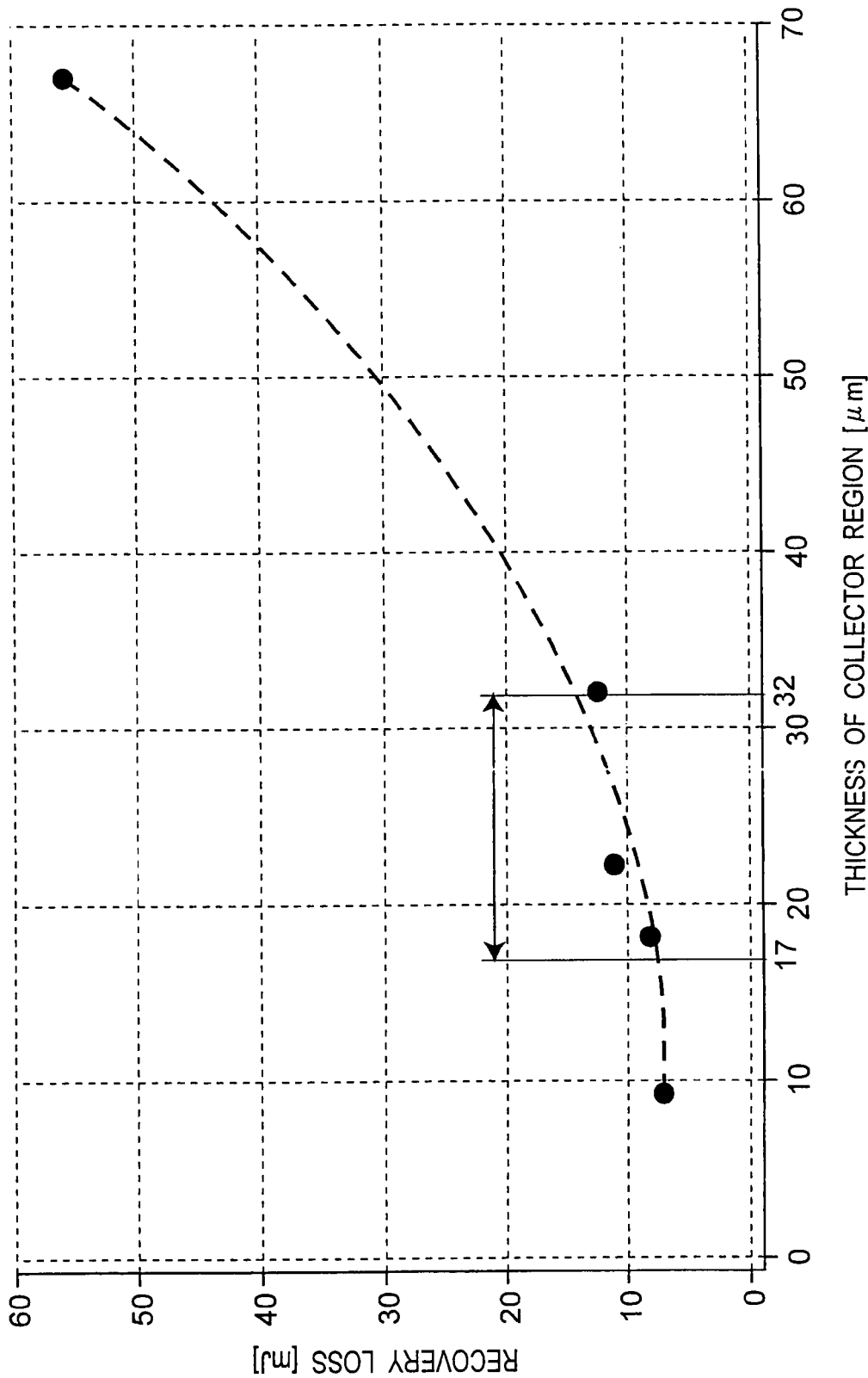
FIG. 4 is a graph showing a relationship between thickness of collector region and recovery loss.
Figure 5:
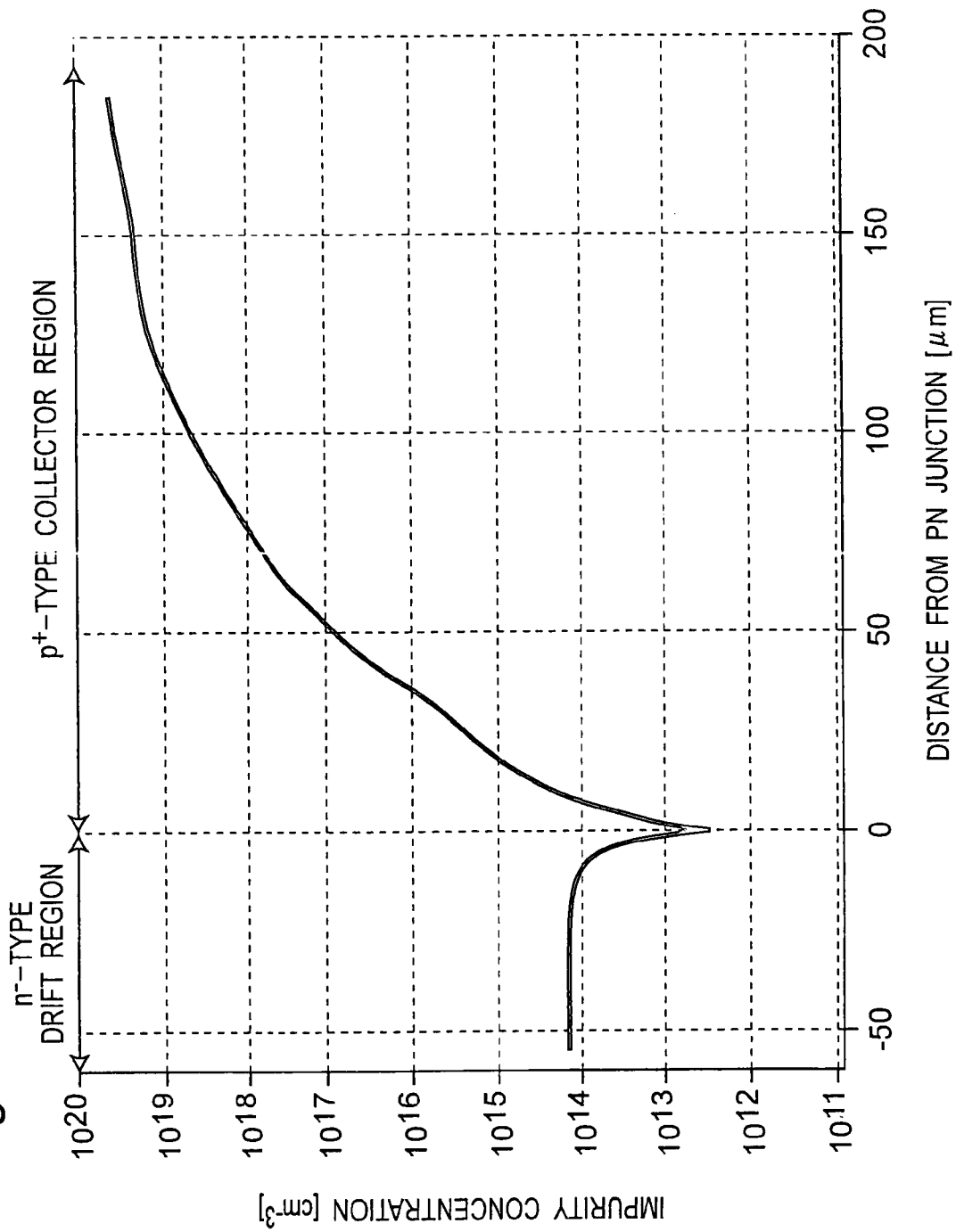
FIG. 5 is a graph illustrating impurity concentration for the position in thickness direction from a PN junction.

The present inventors have conducted a couple of experiments and obtained graphs showing the relationships between the thickness of the p$^+$-type collector region 34 and the reverse withstanding voltage (FIG. 3) and between the thickness of the p$^+$-type collector region 34 and the recovery loss (FIG. 4). The semiconductor devices used in the experiments are ones for a typical power source of AC 400 or 440 volts, of which reverse withstanding voltage is required to be 1200 volts or more. Those experiments were conducted varying the thickness of the p$^+$-type collector region 34 in a range between 0 μm to approximately 80 μm. For reference, FIG. 5 shows the impurity concentration gradation of the semiconductor device before the collector region is polished.

Also, FIG. 3 was obtained by using two different types of the semiconductor devices as indicated in solid and dotted lines. The latter semiconductor device (dotted one) has the highly doped region between the collector region 34 and the collector electrode. 38 in order to reduce the ohmic contact resistance therebetween, and the former one (solid one) has no highly doped region.

As can be seen from FIG. 3, the reverse withstanding voltage of 1300 volts or greater is achieved when the thickness of the $p^+$-type collector region 34 is approximately 17 µm or more, regardless the highly doped region between the collector region 34 and the collector electrode 38. Therefore, the semiconductor device having the thickness of the $p^+$-type collector region 34 that is approximately 17 µm or more can be used for any other semiconductor devices without breakdown, including ones of AC 400 or 440 volts as used in the experiment, requiring the reverse withstanding voltage of 1300 volts or less.

In the meanwhile, the present inventors have compared the saturation voltage when the highly doped region (dotted line) having the impurity concentration of $1 \times 10^{18}$ cm$^{-3}$ or less is formed, with one when no highly doped region is formed (solid line), and have revealed that the saturation voltage is reduced by 0.2 volts with addition of the highly doped region. However, no improvement in the saturation voltage was found when the highly doped region having the impurity concentration exceeding $1 \times 10^{18}$ cm$^{-3}$. This shows that the $p^+$-type highly doped region having the impurity concentration of $1 \times 10^{18}$ cm$^{-3}$ or less advantageously reduces the ohmic contact resistance between the $p^+$-type collector region 34 and the collector electrode 38. However, the $p^+$-type highly doped region provides no substantial impact on the reverse withstanding voltage, as illustrated in FIG. 3.

Furthermore, as shown in FIG. 4, the recovery loss exponentially increases as the thickness of the $p^+$-type collector region 34 increases. While the reverse blocking IGBT is applied with the forward voltage, the carriers are accumulated in the $n^-$-type drift region 36 and the $p^+$-type collector region 34. When the reverse blocking IGBT is applied with the reverse voltage, the accumulated carriers are expelled in the reverse direction to generate a substantial amount of instantaneous current (recovery current), causing the recovery loss. Therefore, the reduced thickness of the $p^+$-type collector region 34 decreases the carriers in the $n^-$-type drift region 36 and the $p^+$-type collector region 34, thereby to reduce the recovery loss. When the thickness of the $p^+$-type collector region 34 is 50 µm, the recovery loss is approximately 30 mJ. Also, the semiconductor device having the $p^+$-type collector region 34 with the thickness of 32 µm or less provides the recovery loss close to 10 µm.

As above, the present inventors have revealed that the semiconductor device having the high withstanding voltage while maintaining the low recovery loss is achieved by designing the thickness of the $p^+$-type collector region 34 to be in the range between approximately 17 µm to 50 µm, preferably 17 µm to 32 µm. Also, it should be noted that the $p^+$-type collector region 34 can easily be polished to have the thickness in the above ranges because the polishing tolerance in polishing the collector region 34 is small enough to control the thickness as desired.

According to one of the aspects of the present invention, the $p^+$-type collector region 34 is formed by polishing (removing) the portion 42 (FIG. 2A) that contains most of the lattice defects so as to have the thickness in the range between approximately 17 µm to 50 µm, preferably 17 µm to 32 µm for reduction of the recovery loss and improvement of the high withstanding voltage.

What is claimed is:

1. A process for manufacturing a semiconductor device, comprising:
   providing a semiconductor substrate of a first conductivity type, having upper and lower surfaces;
   forming a collector region of a second conductivity type on the lower surface of said semiconductor substrate;
   forming at least one pair of isolation regions of the second conductivity type extending from the upper surface of said semiconductor substrate to said collector layer for defining a drift region of the first conductivity type, in conjunction with said collector region;
   forming a base region of the second conductivity type adjacent the upper surface of said semiconductor substrate and within the drift region;
   forming an emitter region of the first conductivity type adjacent the upper surface of said semiconductor substrate and within said base region;
   forming a gate electrode opposing to said base region via an insulating layer; and
   forming an emitter electrode on said emitter region;
   polishing said collector region to have thickness in the range between 17 µm to 50 µm, after forming said gate electrode and said emitter electrode; and
   forming a collector electrode on said polished collector region.

2. The process according to claim 1,
   wherein said collector region is polished to have thickness in the range between 17 µm to 50 µm.

3. The process according to claim 1,
   wherein said collector region is formed by diffusing material of the second conductivity type into the semiconductor substrate.

4. The process according to claim 1,
   wherein said collector region and said isolation regions are formed simultaneously by diffusing material of the second conductivity type into the semiconductor substrate.

5. The process according to claim 1, further comprising:
   forming a highly doped region having an impurity concentration greater than that of said collector region, between said collector region and said collector electrode.

6. The process according to claim 5,
   wherein said highly doped region has the impurity concentration of $1 \times 10^{18}$ cm$^{-3}$ or less.

* * * * *